United States Patent [19]

Miyawaki

[11] Patent Number: 5,374,329
[45] Date of Patent: Dec. 20, 1994

[54] PROCESS FOR PRODUCING A SEMICONDUCTOR WAFER

[75] Inventor: Mamoru Miyawaki, Isehara, Japan

[73] Assignee: Canon Kabushiki Kaisha, Tokyo, Japan

[21] Appl. No.: 173,947

[22] Filed: Dec. 28, 1993

Related U.S. Application Data

[63] Continuation of Ser. No. 11,146, Jan. 29, 1993, abandoned.

[30] Foreign Application Priority Data

Jan. 31, 1992 [JP] Japan ................... 4-40603

[51] Int. Cl.⁵ .............................. B44C 1/22
[52] U.S. Cl. ...................... 156/630; 437/61; 437/228; 437/225; 437/974; 148/DIG. 12; 148/DIG. 135; 156/633; 156/643
[58] Field of Search ............... 156/630, 633, 643; 437/61, 62, 63, 974, 228, 225; 148/DIG. 12, DIG. 135, DIG. 150

[56] References Cited

U.S. PATENT DOCUMENTS

| | | | |
|---|---|---|---|
| 3,954,523 | 5/1976 | Magdo et al. | 437/71 |
| 3,997,381 | 12/1976 | Wanlass | 156/3 |
| 4,380,865 | 4/1983 | Frye et al. | 156/603 |
| 4,459,181 | 7/1984 | Benjamin | 205/124 |
| 4,532,700 | 8/1985 | Kinney et al. | 148/DIG. 86 |
| 4,800,527 | 1/1989 | Ozaki et al. | 365/182 |
| 4,868,140 | 9/1989 | Yonehara | 437/109 |
| 4,968,628 | 11/1990 | Delgado et al. | 437/67 |
| 5,010,033 | 4/1991 | Tokunaga et al. | 437/83 |
| 5,234,535 | 8/1993 | Beyer et al. | 156/643 |
| 5,250,460 | 10/1993 | Yamagata et al. | 148/DIG. 135 |
| 5,258,322 | 11/1993 | Sakaguchi et al. | 437/62 |

FOREIGN PATENT DOCUMENTS 53-45675 12/1978 Japan .
55-16464 2/1980 Japan .

OTHER PUBLICATIONS

L. Vescan et al., "Low–Pressure Vapor–Phase Epitaxy Silicon on Porous Silicon," Materials Letters, vol. 7, No. 3, Sep. 1988, pp. 94–98.
Takai, et al. "Porous Silicon Layers And Its Oxide For The Silicon Insulator Structure", J. App. Phys., vol. 60(1), 1 Jul. 1986, pp. 222, 225.
"Crystalline Quality of Silicon Layer Formed by Fipos Technology," K. Imai et al., Journal of Crystal Growth, vol. 63, No. 3, Oct. 11, 1993, pp. 547–553.
"Electrolytic Shaping of Germanium and Silicon," A. Uhlir, Jr., The Bell System Technical Journal, Mar. 1956, pp. 333–347.
"Formation Mechanism of Porous Silicon Layer by Anodizatioin in HF Solution," T. Unagami, Journal of the Electrochemical Society, vol. 127, Feb., 1980, pp. 476–483.
"A New Dielectric Isolation Method Using Porous Silicon," K. Imai, Solid State Electronics, vol. 24, 1981, pp. 159–164.

Primary Examiner—Brian E. Hearn
Assistant Examiner—Tuan Nguyen
Attorney, Agent, or Firm—Fitzpatrick, Cella, Harper & Scinto

[57] ABSTRACT

According to the present invention, there is provided semiconductor wafer, comprises a plurality of non-porous monocrystal layers laminated with interposition of an insulating layer or insulating layers on a substrate.

37 Claims, 3 Drawing Sheets

PROCESS FOR PRODUCING A SEMICONDUCTOR WAFER

This application is a continuation of application Ser. No. 08/011,146 filed Jan. 29, 1993, now abandoned.

BACKGROUND OF THE INVENTION

1. Field of the Invention

The present invention relates to a semiconductor wafer which is useful for electronic devices and formation of integrated circuits, and a process for the production thereof. More particularly, the present invention relates to a semiconductor wafer comprising a monocrystalline semiconductor layer, and a process for production thereof.

2. Related Background Art

Formation of a thin monocrystalline semiconductor layer on an insulating layer is well known as silicon-on-insulator (SOI) technique. The devices obtained from the wafer of the SOI structure are comprehensively investigated since the devices has many advantages which are not achievable by use of a bulk monocrystalline Si wafer for usual Si integrated circuits. Recent researches on the process for production of the above wafers are roughly classified into three types of processes as below:

(1) processes comprising steps of oxidizing the surface of a monocrystalline Si substrate, forming partially an aperture in the $SiO_2$ layer to expose partially the monocrystalline Si substrate, and growing epitaxially monocrystalline Si in the lateral direction by utilizing the monocrystalline Si as the seed at the aperture portion to form a monocrystalline Si layer on the $SiO_2$.

(2) processes utilizing the monocrystalline Si substrate itself as the active layer, which comprises a step of forming an $SiO_2$ layer under a surface monocrystalline Si layer of a monocrystalline Si substrate with retaining the surface monocrystalline Si layer.

(3) processes comprising steps of growing Si monocrystal epitaxially on a monocrystalline Si substrate, and carrying out an insulative separation.

Neither of the SOI techniques give more than a single layer of a monocrystalline semiconductor layer on an insulating layer, and giving a device which utilizes a monocrystalline semiconductor layer two-dimensionally on the insulating layer.

SUMMARY OF THE INVENTION

An object of the present invention is to provide a semiconductor wafer in which the monocrystalline semiconductor layer on an insulation layer is utilized three-dimensionally, especially in a thickness direction, and to produce easily the semiconductor wafer.

Another object of the present invention is to provide a semiconductor wafer, comprising a plurality of non-porous monocrystal layers laminated with interposition of an insulating layer or insulating layers on a substrate.

A further object of the present invention is to provide a process for producing a semiconductor wafer, comprising the steps of bonding a first intermediate laminate comprising a first tentative substrate of a porous monocrystalline semiconductor and a first monocrystalline semiconductor layer formed thereon on the first tentative substrate onto the surface of a substrate at the first monocrystalline semiconductor side, removing the first tentative substrate by etching, forming an insulating layer on the etched face, bonding a second intermediate laminate comprising a second tentative substrate of a porous monocrystalline semiconductor and a second monocrystalline semiconductor layer formed thereon onto the insulating layer at the second monocrystalline semiconductor side in the same manner as defined above, and removing the second tentative substrate by etching.

DESCRIPTION OF THE PREFERRED EMBODIMENT

The semiconductor wafer of the first embodiment of the present invention comprises a plurality of non-porous monocrystal layers laminated with interposition of an insulating layer on a substrate.

A preferable process for producing a semiconductor wafer according to the present invention comprises the steps of bonding a first intermediate laminate comprising a first tentative substrate of a porous monocrystalline semiconductor and a first monocrystalline semiconductor layer formed thereon onto the surface of a substrate at the first monocrystalline semiconductor side, removing the first tentative substrate by etching, forming an insulating layer on the etched face, bonding a second intermediate laminate comprising a second tentative substrate of a porous monocrystalline semiconductor and a second monocrystalline semiconductor layer formed thereon onto the insulating layer at the second monocrystalline semiconductor side in the same manner as mentioned above, and removing the second tentative substrate by etching.

Figure 1:
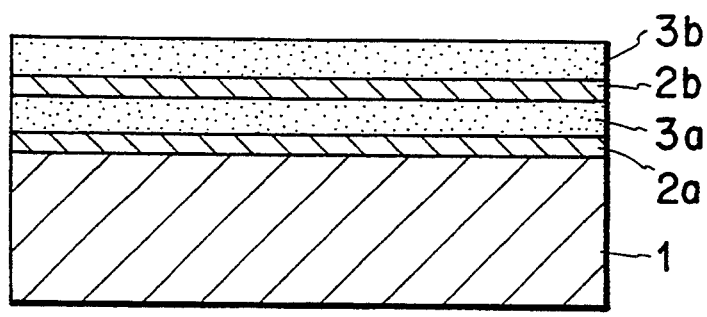
FIG. 1 is a vertical sectional view of a first embodiment of the semiconductor wafer of the present invention.
Figure 2:
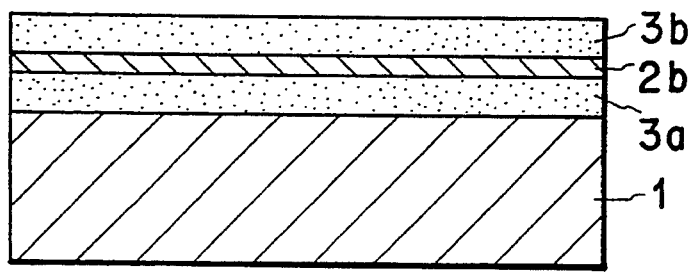
FIG. 2 is a vertical sectional view of a second embodiment of the semiconductor wafer of the present invention.

FIGS. 1 and 2 illustrate examples of the semiconductor wafer of the present invention.

In FIGS. 1 and 2, a numeral 1 refers to the semiconductor wafer, numerals 2a and 2b denote insulating layers, and numerals 3a and 3b denote monocrystalline semiconductor layers 3a, 3b.

The difference between the semiconductor wafers of FIG. 1 and the one of FIG. 2 is presence or absence of the insulating layer 2a. If the substrate 1 has sufficient insulating property, the insulating layer 2a need not be provided, as shown in FIG. 2. If not, on the contrary, an appropriate insulating layer 2a is preferably provided between the substrate 1 and the monocrystalline semiconductor layer 3a as shown in FIG. 1. The interposition of an insulating layer 2a (2b) between the substrate 1 and the monocrystal layers 3a, 3b enables three-dimensional utilization of the monocrystalline semiconductor layers 3a, 3b, for example, in a CMOS construction in a thickness direction, realizing higher integration.

The material for the monocrystalline semiconductor layers 3a, 3b preferably includes monocrystalline Si and GaAs type of III-V group monocrystalline semiconductors because of ease of formation, but is not limited thereto. In the case where the monocrystalline semiconductor layers 3a, 3b are made of monocrystalline Si, the insulating layer 2a (2b) of SiO₂ can readily be formed, but other insulator material may be employed.

Specific examples of the combination of the material for the layers are shown below.

(1) Embodiment shown in FIG. 1 (substrate 1/insulating layer 2a/monocrystalline semiconductor layer 3a/insulating layer 2b/monocrystalline semiconductor layer 3b):

A: monocrystalline Si/SiO₂/monocrystalline Si/SiO₂/monocrystalline Si

B: monocrystalline Si/SiO₂/monocrystalline Si/insulator other than SiO₂/monocrystalline Si C: monocrystalline Si/insulator other than SiO₂/monocrystalline Si/SiO₂/monocrystalline Si D: monocrystalline Si/insulator other than SiO₂/monocrystalline Si/insulator other than SiO₂/monocrystalline Si The "insulator other than SiO₂" includes SiN, Si-O₂—SiN—SiO₂, and the like. In particular, the dielectric constant and the stress between the monocrystalline semiconductor layers 3a and 3b can be controlled by suitably selecting the material of the insulating layer 2b provided between the monocrystalline semiconductor layers 3a and 3b, thereby the capacitive coupling being adjusted and the stress being relaxed. The monocrystalline Si in the above embodiment may be replaced by a GaAs type III-V group monocrystalline semiconductor.

(2) Embodiment shown in FIG. 2 (substrate 1/monocrystalline semiconductor layer 3a/insulating layer 2b/monocrystalline semiconductor layer 3b):

E: silica glass/monocrystalline Si/SiO₂/monocrystalline Si

F: silica glass/monocrystalline Si/insulator other than SiO₂/monocrystalline Si

The monocrystalline Si in the above embodiment may be replaced by a GaAs type III-V group monocrystalline semiconductor similarly as in the case (1) above. The substrate 1 may be made of borosilicate glass or the like. However, when the substrate 1 is made so, an insulating layer 2a is preferably provided as shown in FIG. 1 because the borosilicate is less insulating than silica glass.

Two monocrystalline semiconductor layers 3a and 3b are provided in the embodiment of FIGS. 1 and 2. However, the present invention is not limited thereto. Three or more monocrystalline semiconductor layers 3a and 3b, etc. may be laminated with interposition of insulating layers 2b, etc.

The process for producing the aforementioned semiconductor wafer is described below mainly on lamination of monocrystalline Si layers. However, the present invention is not limited to the one employing monocrystalline Si as the monocrystalline semiconductor layers 3a and 3b.

Figure 3A:
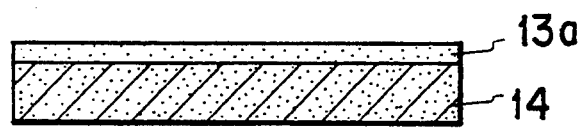
FIGS. 3A to 3E illustrate a process for producing a semiconductor wafer of the present invention.

As shown in FIG. 3A, a porous monocrystalline Si plate is prepared as a tentative substrate 14 by treating a monocrystalline Si plate for entire porousness. On the surface thereof, a monocrystalline Si is grown epitaxially to form a monocrystalline Si layer 13a.

The tentative substrate 14 made of porous monocrystalline Si has pores of the average size of about 600 Å by observation with a transmission electron microscope. Although the density thereof is half or less than the density of monocrystalline Si, the monocrystallinity is retained, and epitaxial growth of monocrystalline Si is possible on the surface.

However, rearrangement of the pores occurs at a temperature above 1000° C., whereby the characteristics of enhanced etching is impaired.. Therefore, the epitaxial growth of monocrystalline Si is preferably conducted by a low temperature growth process such as molecular beam epitaxial growth, plasma CVD, thermal CVD, photo-assisted CVD, bias sputtering, liquid crystal growth, etc.

The porousness treatment of P-type monocrystalline Si and subsequent epitaxial growth of monocrystalline Si are conducted as described below.

Firstly, a monocrystalline Si plate is made porous by anodization by use of an HF solution. While the density of monocrystalline Si is 2.33 g/cm³, the density of porous monocrystalline Si can be varied from 0.6 to 1.1 g/cm³ by varying the concentration of the HF solution in the range of from 20 to 50%. The porous monocrystalline Si is readily formed from P-type monocrystalline Si by the reasons below.

The porous monocrystalline Si was found in the course of study on electropolishing of semiconductors in the year 1956. In the study of dissolving reaction of monocrystalline Si by anodization, it was disclosed that positive holes are required for anodic reaction of monocrystalline Si in an HF solution, and the reaction proceeds according to the formulas below.

$$Si + 2HF + (2-n)e^+ \rightarrow SiF_2 + 2H^+ + ne^-$$

$$SiF_2 + 2HF \rightarrow SiF_4 + H_2$$

$$SiF_4 + 2HF \rightarrow H_2SiF_6$$

or otherwise, $$Si + 4HF + (4-\lambda)e^+ \rightarrow SiF_4 + 4H^+ + \lambda e^-$$

$$SiF_4 + 2HF \rightarrow H_2SiF_6$$

where e⁺ and e⁻ represent respectively a positive hole and an electron; n and λ represent respectively the number of the positive holes required for dissolving one atom of monocrystalline Si, and it was also disclosed that porous monocrystalline Si is formed if n>2, or λ>4.

Accordingly, a P-type monocrystalline Si is considered to be readily made porous. This selectivity in porous structure formation has already been actually proved.

On the other hand, it was also revealed that high-concentration N-type monocrystalline Si can also be made porous. Therefore, the porous structure can be formed whether the structure is of P-type or of N-type.

An example of the conditions for making monocrystalline Si porous by anodization are shown below. The starting material for porous Si by anodization is not limited to monocrystalline Si, but Si of other crystal structure may also be employed.

Applied voltage: 2.6 (V)
Current density: 30 (mA.cm²)
Anodization solution: HF:H₂O:C₂H₅OH=1:1:1
Time: 2.4 (hours)
Thickness of porous monocrystalline Si: 300 (μm)
Porosity: 56%

On the porous monocrystalline Si formed thus as a tentative substrate 14, monocrystalline Si is made to grow epitaxially to form a thin monocrystalline Si layer 13a in a thickness preferably of not more than 50 μm, more preferably not more than 20 μm.

Figure 3B:
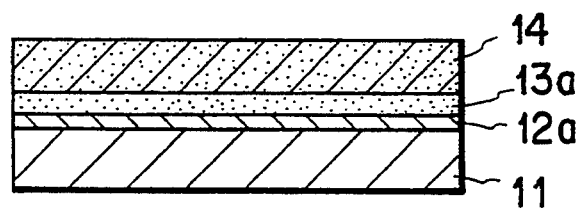

Subsequently, as shown in FIG. 3B, the face of the monocrystalline Si layer 13a on the tentative substrate 14 is bonded onto a substrate 11. This bonding is preferably made after the surface of the monocrystalline Si layer 13a has been oxidized to form a surface $SiO_2$ layer 12a. This is because the interfacial energy level caused by the lower interface of the monocrystalline Si 13a can be made lower on the oxidized film interface than on the above glass interface, even if borosilicate glass is used as the substrate 11, thereby improving remarkably the performance of an electronic device. Otherwise, in the case where a monocrystalline Si layer 13a from which the tentative substrate 14 has been removed by selective etching as described later is bonded to the substrate 11, or in the case where the substrate 11 is monocrystalline Si, the surface thereof may be oxidized to form the $SiO_2$ layer 12a.

The bonding can be made simply by washing the surfaces of the both and bringing them into contact at room temperature to be so strong by Van der Waals force that the bonded matter cannot be separated readily. However, it is preferred that the bonded matter is heat-treated further in a nitrogen atmosphere at a temperature of from 200° to 900° C., more preferably from 600° to 900° C. to make the bonding complete.

Figure 3C:
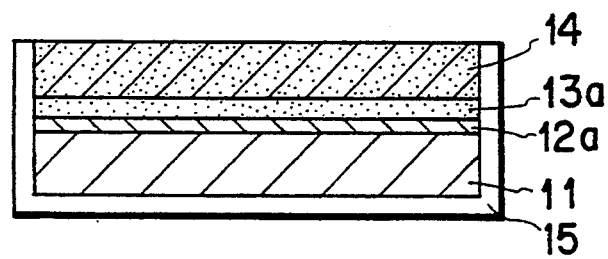

The entire of the bonded tentative substrate 14 and the substrate 11 are covered with deposition of $Si_3N_4$ layer 15 as an etching protection layer as shown in FIG. 3C. Then, the $Si_3N_4$ layer 15 on the surface of the tentative substrate 14 only is removed. The $Si_3N_4$ layer 15 may be replaced by Apiezon Wax.

Figure 3D:
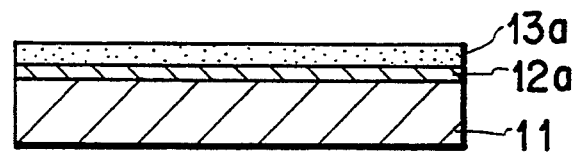

Then, the tentative substrate 14 composed of porous monocrystalline Si is entirely removed by etching or other procedure, thus giving the substrate 11 having one monocrystalline Si layer 13a as shown in FIG. 3D.

The porous monocrystalline Si has a great number of voids formed in the inside thereof, having a density of half or less of the non-porous monocrystalline Si. Consequently, the surface area is greatly increased for the volume thereof, and chemical etching velocity is greatly accelerated in comparison with a normal monocrystal layer. Therefore, an etching solution can be used which is capable of etching both monocrystalline Si and porous monocrystalline Si. However, it is preferable to use an etching solution which exhibits weak or no etching activity to non-porous monocrystalline Si and etches preferentially porous monocrystalline Si.

The etching solution which does not etch non-porous monocrystalline Si but etches selectively porous monocrystalline Si includes hydrofluoric acid; buffered hydrofluoric acid such as a mixture of ammonium fluoride ($NH_4F$) with hydrogen fluoride (HF); mixtures of hydrofluoric acid or a buffered hydrofluoric acid with a hydrogen peroxide solution; mixtures of hydrofluoric acid or a buffered hydrofluoric acid with an alcohol; and mixtures of hydrofluoric acid or a buffered hydrofluoric acid with a hydrogen peroxide solution and an alcohol. A tentative substrate 14 having a monocrystalline Si layer 13a formed thereon or a tentative substrate 14 bonded with a substrate 11 is etched by wetting with such a solution.

The etching rate depends on the concentration of hydrofluoric acid, buffered hydrofluoric acid, and hydrogen peroxide solution, and the temperature of the solution. The addition of a hydrogen peroxide solution accelerates oxidation of Si, thereby increasing the reaction rate compared to the rate of the solution free from hydrogen peroxide. The reaction rate can be controlled by changing the ratio of the hydrogen peroxide solution. The addition of an alcohol enables immediate removal, by agitation, of gas bubbles formed by the etching reaction from the etching surface, making the etching of the porous monocrystal Si uniform and efficient.

The concentration of HF in the buffered hydrofluoric acid is preferably in the range of from 1 to 95%, more preferably from 1 to 85%, still more preferably from 1 to 70% by weight of the etching solution. The concentration of $NH_4$ in the buffered hydrofluoric acid is preferable in the range of from 1 to 95%, preferably from 5 to 90%, still more preferably from 5 to 80% by weight of the etching solution.

The concentration of HF is preferably in the range of from 1 to 95%, more preferably from 5 to 90%, still more preferably from 5 to 80% by weight of the etching solution.

The concentration of $H_2O_2$ is preferably in the range of from 1 to 95%, more preferably from 5 to 90%, still more preferably from 10 to 80% by weight of the etching solution, and is decided so as to attain the aforementioned effect of the hydrogen peroxide solution.

The concentration of the alcohol is preferably not higher than 80%, more preferably not higher than 60%, still more preferably not higher than 40% by weight of the etching solution, and is decided so as to attain the aforementioned effect of the alcohol. The alcohol includes ethyl alcohol, isopropyl alcohol, and the like. Any alcohol may be used which does not practicably impede the production process and exhibits the aforementioned effect of alcohol addition.

The etching temperature is preferably in the range of from 0° to 100° C., more preferably from 5 to 80° C., still more preferably from 5 to 60° C.

Figure 3E:
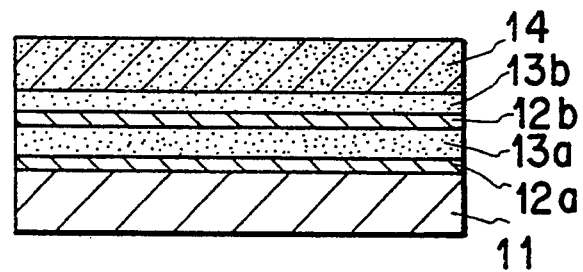

Further, in the present invention, another monocrystalline Si layer 13b is formed on another tentative substrate 14 in the same manner as above, and the face of this monocrystalline Si layer 13b is bonded to the face of the monocrystalline Si layer 13a formed on the substrate 11 in the manner as above with interposition of an $SiO_2$ layer 12b, as shown in FIG. 3E. This $SiO_2$ layer 12b is formed prior to the bonding by oxidation of the surface of the monocrystalline Si layer 13a or 13b. Thereafter, the tentative substrate 14 is removed by etching in the same manner as above to obtain a semiconductor wafer similar to the one shown in FIG. 1. The semiconductor as shown in FIG. 2 is provided in the same procedure without forming the $SiO_2$ layer 12a. It is readily understood that three or more of monocrystalline Si layers can be laminated by repeating the lamination process described above.

In the above description, the tentative substrate 14 is prepared by making a monocrystalline Si plate entirely porous. However, a tentative substrate may be employed which has been prepared by making a monocrystal Si plate porous only at the surface of one side. In this case naturally, the epitaxial growth of the monocrystalline Si is allowed to proceed on the porous surface. After the bonding of this tentative substrate 14 having a monocrystal Si layer 13a (13b) onto the substrate 11, the tentative substrate 14 is removed by firstly polishing off the non-porous portion of the tentative substrate 14 and then etching off the porous portion thereof in the same manner as above.

In the case where a monocrystalline semiconductor of the GaAs type III-V group is employed in place of the monocrystalline Si, the lamination can be conducted readily as shown below.

Firstly, a monocrystalline Si layer is formed on a tentative substrate, and on this monocrystalline Si layer, a monocrystalline semiconductor of GaAs type III-V group is grown epitaxially. Then the face of the monocrystalline semiconductor of GaAs type III-V group on the tentative substrate is bonded to a substrate or an insulating layer in the same manner as above, and the tentative substrate and the monocrystalline Si layer are removed by etching or other procedure, thus the monocrystalline semiconductor layer of GaAs type III-V group is laminated.

Figure 4A:
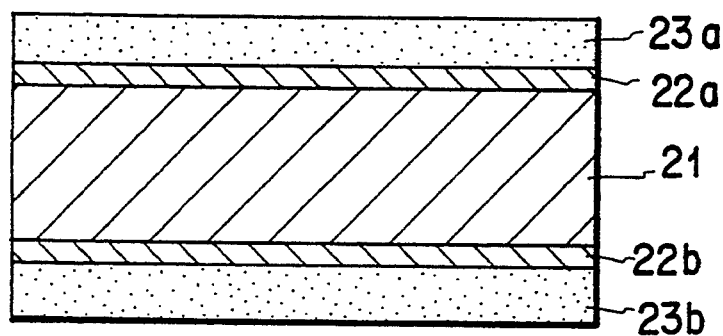
FIGS. 4A and 4B are vertical sectional views of a third embodiment and a fourth embodiment of the semiconductor wafer of the present invention, respectively.
Figure 4B:
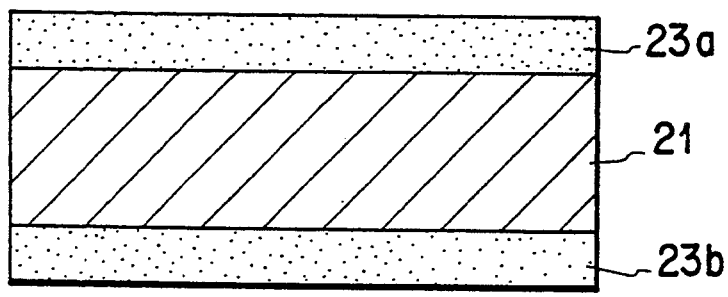

By the procedure described above, another type of semiconductor wafer can readily be prepared which is constructed of a substrate 21 and monocrystalline semiconductor layers 23a and 23b on the both surfaces of the substrate as shown in FIGS. 4A and 4B. The one shown in FIG. 4A has monocrystalline semiconductor layer 23a and 23b formed on the both surfaces of the substrate 21 with interposition of insulation layers 22a and 22b, while the one shown in FIG. 4B has monocrystalline semiconductor layers 23a and 23b formed directly on both surfaces of an insulating substrate 21.

The present invention is described in more detail by reference to examples.

EXAMPLE 1

A P-type (100) monocrystalline Si plate (Si wafer) of 3 inches in diameter and 200 $\mu$m in thickness was anodized in a 50 wt % HF solution at a current density of 100 mA/cm$^2$. The porous structure formation rate was 8.4 $\mu$m/min. The entire of the P-type (100) Si plate of 200 $\mu$m thick was made porous in 24 minutes.

On the resulting P-type (100) porous Si plate as a tentative substrate, an Si epitaxial layer was made to grow by an MBE method (molecular beam epitaxy) to a thickness of 0.5 $\mu$m. The deposition conditions were as follows:
Temperature: 700° C.
Pressure: $1 \times 10^{-9}$ Torr
Growth rate: 0.1 nm/sec Onto the surface of this epitaxial layer, an Si substrate was superposed which had an SiO$_2$ layer of 5000 Å on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8).

The etching rate of normal monocrystalline Si in hydrofluoric nitric acetic acid (1:3:8) is about 1 micron or less per minute, while the etching rate of the porous Si layer is about 100 times that of non-porous normal monocrystalline Si layer as described before. Thus, the porous tentative Si substrate of 200 $\mu$m thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

EXAMPLE 2

A P-type (100) monocrystalline Si plate of 4 inches in diameter and 500 $\mu$m in thickness was anodized in a 50 wt % HF solution at a current density of 100 mA/cm$^2$. The porous structure formation rate was 8.4 $\mu$m/min. The entire of the P-type (100) Si plate of 500 $\mu$m thick was made porous in 60 minutes.

On the resulting P-type (100) porous Si plate as a tentative substrate, an Si epitaxial layer was made to grow at a low temperature by a plasma CVD method to a thickness of 0.5 $\mu$m. The deposition conditions were as follows:
Gas: SiH$_4$
Radio frequency power: 100 W
Temperature: 800° C.
Pressure: $1 \times 10^{-2}$ Torr
Growth rate: 2.5 nm/sec Onto the surface of this epitaxial layer, an Si substrate was superposed which had an SiO$_2$ layer 24 of 5000 Å on the surface thereof, and the superposed matter was heated in a nitrogen atmosphere at 700° C. for 0.5 hour to bond the tentative substrate and the substrate tightly. Then the porous tentative Si substrate was removed by etching by use of a hydrofluoric nitric acetic acid solution (1:3:8).

The etching rate of normal monocrystalline Si in hydrofluoric nitric acetic acid (1:3:8) is about 1 micron or less per minute, while the etching rate of the porous Si layer is about 100 times that of non-porous normal monocrystalline Si layer as described before. Thus, the porous tentative Si substrate of 500 $\mu$m thick was removed in 5 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

EXAMPLE 3

A P-type (100) monocrystalline Si plate (Si wafer) of 3 inches in diameter and 200 $\mu$m in thickness was anodized in a 50 wt % HF solution at a current density of 100 mA/cm$^2$. The porous structure formation rate was 8.4 $\mu$m/min. The entire of the P-type (100) Si plate of 200 $\mu$m thick was made porous in 24 minutes.

On the resulting P-type (100) porous Si plate as a tentative substrate, an Si epitaxial layer was made to grow by a bias sputtering method to a thickness of 0.5 $\mu$m. The deposition conditions were as follows:
RF frequency: 100 MHz
Radio frequency power: 600 W
Temperature: 300° C.
Ar gas pressure: $8 \times 10^{-3}$ Torr
Growth time: 60 min
Target DC bias: $-200$ V
Substrate DC bias: $+5$ V Onto the surface of this epitaxial layer, an Si substrate was superposed which had an SiO$_2$ layer of 5000 Å on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8).

The etching rate of normal monocrystalline Si in hydrofluoric nitric acetic acid (1:3:8) is about 1 micron or less per minute, while the etching rate of the porous Si layer is about 100 times that of non-porous normal monocrystalline Si layer as described before. Thus, the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 4

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 0.5 μm. The growth conditions were as follows:
Solvent: Sn
Growth temperature: 900° C.
Growth atmosphere: $H_2$
Growth time: 10 min Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 5

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a low pressure CVD method to a thickness of 0.5 μm. The deposition conditions were as follows:
Source gas: $SiH_4$
Carrier gas: $H_2$
Temperature: 850° C.
Pressure: $1 \times 10^{-2}$ Torr Growth rate: 3.3 nm/sec Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 6

On a P-type (100) Si plate of 3 inches in diameter and 200 μm in thickness, an Si epitaxial layer was made to grow to a thickness of 1 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 2 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a tentative substrate. In the anodization, the P-type (100) Si plate only was made porous, and the Si epitaxial layer remained intact.

Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 7

On a P-type (100) Si plate of 3 inches in diameter and 200 μm in thickness, an Si epitaxial layer was made to grow to a thickness of 0.5 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 1 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a tentative substrate. In the anodization, the P-type (100) Si plate only was made porous, and the Si epitaxial layer remained intact.

Onto the surface of this epitaxial layer 122, an Si substrate was superposed which had an SiO₂ layer of 5000 Å thick on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO₂ layer.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 1.

EXAMPLE 8

On the surface of a P-type (100) Si plate of 3 inches in diameter and 200 μm in thickness, an N-type Si layer was formed in a thickness of 1 μm by proton ion implantation. The amount of implanted H+ was $5 \times 10^{15}$ (ions/cm²).

This plate was anodized in a 50 wt % HF solution at a current density of 100 mA/cm². The porous structure formation rate was 8.4 μm/min. The entire of the P-type (100) Si plate of 200 μm thick was made porous in 24 minutes to give a tentative substrate. In the anodization, the P-type (100) Si plate only was made porous, and the N-type Si layer remained intact as mentioned above.

Onto the surface of this N-type Si layer, an Si substrate was superposed which had an SiO₂ layer of 5000 Å thick on the surface thereof, and the superposed matter was heated in a nitrogen atmosphere at 800° C. for 0.5 hour to bond the tentative substrate and the substrate tightly. Then the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO₂ layer.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 1.

EXAMPLE 9

A P-type (100) monocrystalline Si plate of 3 inches in diameter and 200 μm in thickness was anodized in a 50 wt % HF solution at a current density of 100 Ma/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer 12 was made to grow by an MBE method (molecular beam epitaxy) to a thickness of 0.5 μm. The deposition conditions were as follows:

Temperature: 700° C.
Pressure: $1 \times 10^{-9}$ Torr
Growth rate: 0.1 nm/sec

Onto the surface of this epitaxial layer, an Si substrate was superposed which had an SiO₂ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with Si₃N₄ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO₂ layer.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 1.

EXAMPLE 10

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a plasma CVD method to a thickness of 0.5 μm. The deposition conditions were as follows:

Gas: SiH₄
Radio frequency power: 100 W
Temperature: 800° C.
Pressure: $1 \times 10^{-2}$ Torr
Growth rate: 2.5 nm/sec Onto the surface of this epitaxial layer, an Si substrate was superposed which had an SiO₂ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with Si₃N₄ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO₂ layer.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 1.

EXAMPLE 11

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a bias sputtering method to a thickness of 0.5 μm. The deposition conditions were as follows:
RF frequency: 100 MHz
Radio frequency power: 600 W
Temperature: 300° C.
Ar gas pressure: 8×10$^{-3}$ Torr
Growth time: 60 min
Target DC bias: −200 V
Substrate DC bias: +5 V Onto the surface of this epitaxial layer, an Si substrate was superposed which had an SiO$_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

In the case where the Si$_3$N$_4$ layer was replaced by Apiezon Wax coating, the effect was the same, and the porous tentative Si substrate only was removed completely.

EXAMPLE 12

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 0.5 μm. The growth conditions were as follows:
Solvent: Sn
Growth temperature: 900° C.
Growth atmosphere: H$_2$
Growth time: 10 min
Target DC bias: −200 V
Substrate DC bias: +5 V Onto the surface of this epitaxial layer, an Si substrate was superposed which had an SiO$_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

In the case where the Si$_3$N$_4$ layer was replaced by Apiezon Wax coating, the same effect was attained, and the porous tentative Si substrate only was removed completely.

EXAMPLE 13

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a low pressure CVD method to a thickness of 0.5 μm. The deposition conditions were as follows:
Source gas: SiH$_4$
Carrier gas: H$_2$
Temperature: 850° C.
Pressure: 1×10$^{-2}$ Torr
Growth rate: 3.3 nm/sec Onto the surface of this epitaxial layer, an Si substrate was superposed which had an SiO$_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

In the case where SiH$_2$Cl$_2$ was used as the source gas, the temperature of the epitaxial growth of Si was required to be raised by several tens of degrees, but the characteristic enhanced etching properties of the porous tentative substrate were kept.

EXAMPLE 14

On a P-type (100) Si plate of 3 inches in diameter and 200 μm in thickness, an Si epitaxial layer was made to Grow to a thickness of 1 μm by a CVD method. The deposition conditions were as follows:
Reactive Gas flow rate: $SiH_2Cl_2$, 1000 SCCM
$H_2$: 230 l/min
Temperature: 1080° C.
Pressure: 80 Torr
Time: 2 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the Si epitaxial layer remained intact.

Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 15

On a P-type (100) Si plate of 3 inches in diameter and 200 μm in thickness, an Si epitaxial layer was made to grow to a thickness of 0.5 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 1 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the Si epitaxial layer remained intact.

Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 16

On the surface of a P-type (100) Si plate of 3 inches in diameter and 200 μm in thickness, an N-type Si layer was formed in a thickness of 1 μm by proton ion implantation. The amount of implanted $H^+$ was $5 \times 10^{15}$ (ions/cm$^2$).

This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the N-type Si layer remained intact.

Onto the surface of this N-type Si layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 17

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate.

On the resulting P-type (100) porous Si plate as a tentative substrate, an Si epitaxial layer was made to grow by an MBE method (molecular beam epitaxy) to a thickness of 0.5 μm. The deposition conditions were as follows:
Temperature: 700° C.
Pressure: 1×10⁻⁹ Torr
Growth rate: 0.1 nm/sec Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 18

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes to give a porous tentative Si substrate.

On the resulting P-type (100) porous Si plate as a tentative substrate, an Si epitaxial layer was made to grow by a plasma CVD method to a thickness of 5 μm. The deposition conditions were as follows:
Gas: $SiH_4$
Radio frequency power: 100 W
Temperature: 800° C.
Pressure: 1×10⁻² Torr
Growth rate: 2.5 nm/sec Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a 6M KOH solution. Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 19

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a bias sputtering method to a thickness of 1 μm. The deposition conditions were as follows:
RF frequency: 100 MHz
Radio frequency power: 600 W
Temperature: 300° C.
Ar gas pressure: 8×10⁻³ Torr
Growth time: 120 min
Target DC bias: −200 V
Substrate DC bias: +5 V Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

In the case where the $Si_3N_4$ layer was replaced by Apiezon Wax coating, the effect was the same, and the porous tentative Si substrate only was removed completely.

EXAMPLE 20

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 5 μm. The growth conditions were as follows:
Solvent: Sn
Growth temperature: 900° C.
Growth atmosphere: $H_2$
Growth time: 10 min The surface of this epitaxial layer was brought into close contact with an $SiO_2$ layer of 5000 Å thick formed on an Si substrate, and the contacted matter was heated in a nitrogen atmosphere at 700° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

In the case where the $Si_3N_4$ layer was replaced by Apiezon Wax coating, the effect was the same, and the porous tentative Si substrate only was removed completely.

EXAMPLE 21

A P-type (100) monocrystalline Si plate of 3 inches in diameter and 200 μm in thickness was anodized in a 50 wt % HF solution at a current density of 100 $mA/cm^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow at a low temperature by a low pressure CVD method to a thickness of 1.0 μm. The deposition conditions were as follows:
Source gas: $SiH_4$
Carrier gas: $H_2$
Temperature: 850° C.
Pressure: $1 \times 10^{-2}$ Torr
Growth rate: 3.3 nm/sec The surface of this epitaxial layer was brought into contact with an $SiO_2$ layer of 5000 Å thick formed on an Si substrate, and the contacted matter was heated in a nitrogen atmosphere at 700° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

In the case where $SiH_2Cl_2$ was used as the source gas, the temperature of the epitaxial growth of Si was required to be raised by several tens of degrees, but the characteristic enhanced etching properties of the porous tentative substrate were kept.

EXAMPLE 22

On a P-type (100) Si plate of 3 inches in diameter and 200 μm in thickness, an Si epitaxial layer was made to grow to a thickness of 1 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 2 min This P-type (100) Si plate was anodized in a 50 wt % HF solution at a current density of 100 $mA/cm^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the Si epitaxial layer remained intact.

Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 23

On a P-type (100) Si plate of 4 inches in diameter and 500 μm in thickness, an Si epitaxial layer was made to grow to a thickness of 0.5 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 1 min This P-type (100) Si plate was anodized in a 50 wt % HF solution at a current density of 100 $mA/cm^2$. The porous structure formation rate was 8.4 μm/min. The entire of the P-type (100) Si plate of 500 μm thick was made porous. In the anodization, the P-type (100) Si plate only was made porous to give a porous tentative Si substrate, and the Si epitaxial layer remained intact.

The surface of this epitaxial layer was brought into close contact with an $SiO_2$ layer of 5000 Å thick formed on an Si substrate, and the contacted matter was heated in a nitrogen atmosphere at 700° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 500 μm thick was removed in 7 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 24

On the surface of a P-type (100) Si plate of 3 inches in diameter and 200 μm in thickness, an N-type Si layer was formed in a thickness of 1 μm by proton ion implantation. The amount of implanted $H^+$ was $5 \times 10^{15}$ (ions/cm$^2$).

This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the N-type Si layer remained intact.

The surface of this epitaxial layer was brought into contact with an $SiO_2$ layer of 5000 Å thick formed on an Si substrate, and the contacted matter was heated in a nitrogen atmosphere at 700° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 25

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by an MBE method (molecular beam epitaxy) to a thickness of 0.5 μm. The deposition conditions were as follows:
Temperature: 700° C.
Pressure: $1 \times 10^{-9}$ Torr
Growth rate: 0.1 nm/sec Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 26

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a plasma CVD method to a thickness of 5 μm. The deposition conditions were as follows:
Gas: $SiH_4$
Radio frequency power: 100 W
Temperature: 800° C.
Pressure: $1 \times 10^{-2}$ Torr
Growth rate: 2.5 nm/sec Onto the surface of this epitaxial layer, an Si substrate was superposed which had an $SiO_2$ layer of 5000 Å thick on the surface thereof, and the superposed matter was heated in a nitrogen atmosphere at 800° C. for 0.5 hour to bond the tentative substrate and the substrate tightly. Subsequently the porous tentative Si substrate was removed by etching by use of a 6M KOH solution. The etching rate of normal monocrystalline Si in 6M KOH solution is about 1 micron or less per minute, while the etching rate of the porous Si is about 100 times that of normal monocrystalline Si. Therefore the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 27

A P-type (100) monocrystalline Si plate of 5 inches in diameter and 600 μm in thickness was anodized in a 50 wt % HF solution at a current density of 100 mA/cm$^2$. The porous structure formation rate was 8.4 μm/min. The entire of the P-type (100) Si plate of 600 μm thick was made porous in 70 minutes.

On the resulting P-type (100) porous Si plate as a tentative substrate, an Si epitaxial layer was made to grow by a bias sputtering method to a thickness of 1 μm. The deposition conditions were as follows:
RF frequency: 100 MHz
Radio frequency power: 600 W
Temperature: 300° C.
Ar gas pressure: $8 \times 10^{-3}$ Torr
Growth time: 120 min
Target DC bias: −200 V
Substrate DC bias: +5 V Onto the surface of this epitaxial layer, an Si substrate was superposed which had an SiO$_2$ layer of 5000 Å thick on the surface thereof, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 600 μm thick was removed in 7 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

EXAMPLE 28

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 5 μm. The growth conditions were as follows:
Solvent: Sn
Growth temperature: 900° C.
Growth atmosphere: H$_2$
Growth time: 10 min The surface of this epitaxial layer was brought into close contact with an SiO$_2$ layer of 5000 Å thick formed on an Si substrate, and the contacted matter was heated in a nitrogen atmosphere at 700° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

EXAMPLE 29

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a low pressure CVD method to a thickness of 0.1 μm. The deposition conditions were as follows:
Source gas: SiH$_4$
Carrier gas: H$_2$
Temperature: 850° C.
Pressure: $1 \times 10^{-2}$ Torr
Growth rate: 3.3 nm/sec The surface of this epitaxial layer was brought into close contact with an SiO$_2$ layer of 5000 Å thick formed on an Si substrate, and the contacted matter was heated in a nitrogen atmosphere at 700° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

In the case where SiH$_2$Cl$_2$ was used as the source gas, the temperature of the epitaxial growth of Si was required to be raised by several tens of degrees, but the characteristic enhanced etching properties of the porous tentative substrate were kept.

EXAMPLE 30

On a P-type (100) Si plate of 3 inches in diameter and 200 μm in thickness, an Si epitaxial layer was made to grow to a thickness of 1 μm by a CVD method. The deposition conditions were as follows:
Reactive gas flow rate: SiH$_2$Cl$_2$, 1000 SCCM
H$_2$: 230 l/min
Temperature: 1080° C.
Pressure: 80 Torr
Time: 2 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous to give a porous tentative Si substrate. In the anodization, the P-type (100) Si plate only was made porous, and the Si epitaxial layer remained intact.

Onto the surface of this epitaxial layer, an Si substrate was superposed which had an SiO$_2$ layer of 5000 Å thick on the surface thereof, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an SiO$_2$ layer.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 1.

EXAMPLE 31

On a P-type (100) Si plate of 3 inches in diameter and 200 μm in thickness, an Si epitaxial layer was made to grow to a thickness of 0.5 μm by a CVD method. The deposition conditions were as follows:
Reactive gas flow rate: $SiH_2Cl_2$, 1000 SCCM
$H_2$: 230 l/min
Temperature: 1080° C.
Pressure: 80 Torr
Time: 1 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the Si epitaxial layer remained intact.

The surface of this epitaxial layer was brought into contact with an $SiO_2$ layer of 5000 Å thick formed on an Si substrate, and the contacted matter was heated in a nitrogen atmosphere at 700° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 32

On the surface of a P-type (100) Si plate of 3 inches in diameter and 200 μm in thickness, an N-type Si layer was formed in a thickness of 1 μm by proton ion implantation. The amount of implanted H$^+$ was $5 \times 10^{15}$ (ions/cm$^2$).

This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the N-type Si layer remained intact.

The surface of this epitaxial layer was brought into close contact with an $SiO_2$ layer of 5000 Å thick formed on a substrate, and the contacted matter was heated in a nitrogen atmosphere at 700° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer with interposition of an $SiO_2$ layer.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 1.

EXAMPLE 33

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow at a low temperature by an MBE method to a thickness of 0.5 μm. The deposition conditions were as follows:
Temperature: 700° C.
Pressure: $1 \times 10^{-9}$ Torr
Growth rate: 0.1 nm/sec Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer directly bonded thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 34

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a plasma CVD method to a thickness of 5 μm. The deposition conditions were as follows:
Gas: $SiH_4$
Radio frequency power: 100 W
Temperature: 800° C.
Pressure: $1 \times 10^{-2}$ Torr
Growth rate: 2.5 nm/sec Onto the surface of this epitaxial layer, an optically polished glass substrate having a softening point of about 500° C. was superposed, and the superposed matter was heated in a nitrogen atmosphere at 450° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a 6M KOH solution. Thereby the porous tentative Si substrate of 200 μm thick was removed in 2 minutes to give a substrate having a monocrystalline Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 35

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a bias sputtering method to a thickness of 1.0 μm. The deposition conditions were as follows:
RF frequency: 100 MHz
Radio frequency power: 600 W
Temperature: 300° C.
Ar gas pressure: $8 \times 10^{-3}$ Torr
Growth time: 120 min
Target DC bias: −200 V
Substrate DC bias: +5 V Onto the surface of this epitaxial layer, an optically polished glass substrate having a softening point of about 500° C. was superposed, and the superposed matter was heated in a nitrogen atmosphere at 450° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer directly bonded thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

In the case where the $Si_3N_4$ layer was replaced by Apiezon Wax coating, the effect was the same, and the porous tentative Si substrate only was removed.

EXAMPLE 36

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 10 μm. The growth conditions were as follows:
Solvent: Sn
Growth temperature: 900° C.
Growth atmosphere: $H_2$
Growth time: 20 min The surface of this epitaxial layer was superposed onto a surface of an optically polished glass substrate having a softening point of about 800° C., and the superposed matter was heated in a nitrogen atmosphere at 750° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline crystal Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

In the case where the $Si_3N_4$ layer was replaced by Apiezon Wax coating, the effect was the same, and the porous tentative Si substrate only was removed completely.

EXAMPLE 37

A P-type (100) monocrystalline Si plate of 3 inches in diameter and 200 μm in thickness was anodized in a 50 wt % HF solution at a current density of 100 mA/cm$^2$. The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a low pressure CVD method to a thickness of 1.0 μm. The deposition conditions were as follows:
Source gas: $SiH_4$, 800 SCCM
Carrier gas: $H_2$, 150 l/min
Temperature: 850° C.
Pressure: $1 \times 10^{-2}$ Torr
Growth rate: 3.3 nm/sec Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. The tentative substrate and the substrate bonded together were coated with $Si_3N_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution. Thereby the porous tentative Si substrate of 200 μm thick was removed in 2 minutes to give a substrate having the monocrystalline Si layer bonded directly thereto.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 2.

In the case where SiH$_2$Cl$_2$ was used as the source gas, the temperature of the epitaxial growth of Si was required to be raised by several tens of degrees, but the characteristic enhanced etching properties of the porous tentative substrate were kept.

EXAMPLE 38

On a P-type (100) Si plate of 4 inches in diameter and 300 μm in thickness, an Si epitaxial layer was made to grow to a thickness of 1 μm by a CVD method. The deposition conditions were as follows:
Reactive gas flow rate: SiH$_2$Cl$_2$, 1000 SCCM
H$_2$: 230 l/min
Temperature: 1080° C.
Pressure: 80 Torr
Time: 2 min This P-type (100) Si plate was anodized in a 50 wt % HF solution at a current density of 100 mA/cm$^2$. The porous structure formation rate was 8.4 μm/min. The entire of the P-type (100) Si plate of 300 μm thick was made porous in 36 minutes to give a porous tentative Si substrate. In the anodization, the P-type (100) Si plate only was made porous, and the Si epitaxial layer remained intact.

Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film 155 on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 300 μm thick was removed in 4 minutes to give a substrate having the monocrystalline Si layer bonded directly thereto.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 2.

EXAMPLE 39

On a P-type (100) Si plate of 3 inches in diameter and 200 μm in thickness, an Si epitaxial layer was made to grow to a thickness of 0.5 μm by a CVD method. The deposition conditions were as follows:
Reactive gas flow rate: SiH$_2$Cl$_2$, 1000 SCCM
H$_2$: 230 l/min
Temperature: 1080° C.
Pressure: 80 Torr
Time: 1 min This P-type (100) Si plate was anodized in a 50 wt % HF solution at a current density of 100 mA/cm$^2$. The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous to give a porous tentative Si substrate, and the Si epitaxial layer remained intact.

Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer bonded directly thereto.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 2.

EXAMPLE 40

On the surface of a P-type (100) Si plate of 4 inches in diameter and 300 μm in thickness, an N-type Si layer was formed in a thickness of 1 μm by proton ion implantation. The amount of implanted H+ was $5 \times 10^{15}$ (ions/cm$^2$).

This P-type (100) Si plate was anodized in a 50 wt % HF solution at a current density of 100 mA/cm$^2$. The porous structure formation rate was 8.4 μm/min. The entire of the P-type (100) Si plate of 299 μm thick was made porous in 37 minutes to give a porous tentative Si substrate. In the anodization, the P-type (100) Si plate only was made porous, and the N-type Si layer remained intact.

Onto the surface of N-type Si layer, a fused quartz glass substrate having been optically polished was superposed, and the superposed matter was heated in a nitrogen atmosphere at 800° C. for 0.5 hour to bond the tentative substrate and the substrate tightly. The tentative substrate and the substrate bonded together were coated with Si$_3$N$_4$ in a thickness of 0.1 μm by a low pressure CVD method. Then the nitride film on the porous tentative substrate only was removed by reactive ion etching. Subsequently the porous tentative Si substrate was removed by etching by use of a hydrofluoric nitric acetic acid solution. Thereby the porous tentative Si substrate of 299 μm thick was removed in 4 minutes to give a substrate having the monocrystalline Si layer bonded directly thereto.

The surface of the monocrystalline Si layer on the substrate was oxidized to form an SiO$_2$ layer of 5000 Å thick. Then one more monocrystalline Si layer was laminated on the SiO$_2$ layer by use of a tentative substrate having an epitaxially grown monocrystalline Si layer in the same manner as above to obtain a semiconductor wafer as shown in FIG. 2.

EXAMPLE 41

A P-type (100) monocrystalline Si plate of 3 inches in diameter and 200 μm in thickness was anodized in a 50 wt % HF solution at a current density of 100 mA/cm$^2$.

The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by an MBE method to a thickness of 0.5 μm. The deposition conditions were as follows:
Temperature: 700° C.
Pressure: $1 \times 10^{-9}$ Torr
Growth rate: 0.1 nm/sec Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution. Thereby the porous tentative Si substrate of 200 μm thick was removed in 2 minutes to give a substrate having the monocrystalline Si layer directly bonded thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 42

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a plasma CVD method to a thickness of 5 μm. The deposition conditions were as follows:
Gas: $SiH_4$
Radio frequency power: 100 W
Temperature: 800° C.
Pressure: $1 \times 10^{-2}$ Torr
Growth rate: 2.5 nm/sec Onto the surface of this epitaxial layer, an optically polished glass substrate having a softening point of about 500° C. was superposed, and the superposed matter was heated in a nitrogen atmosphere at 450° C. for 0.5 hour to bond the tentative substrate and the substrate tightly. Subsequently the porous tentative Si substrate was removed by etching by use of a 6M KOH solution. Thereby the porous tentative Si substrate of 200 μm thick was removed in 2 minutes to give a substrate having the monocrystalline Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 43

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a bias sputtering method to a thickness of 1.0 μm. The deposition conditions were as follows:
RF frequency: 100 MHz
Radio frequency power: 600 W
Temperature: 300° C.
Ar gas pressure: $8 \times 10^{-3}$ Torr
Growth time: 120 min
Target DC bias: $-200$ V
Substrate DC bias: $+5$ V Onto the surface of this epitaxial layer, an optically polished glass substrate having a softening point of about 500° C. was superposed, and the superposed matter was heated in a nitrogen atmosphere at 450° C. for 0.5 hour to bond the tentative substrate and the substrate tightly. Subsequently the porous tentative Si substrate was removed by etching by use of a 7M NaOH solution. The etching rate of normal monocrystalline Si in 7M NaOH solution is about 1 micron or less per minute, while the etching rate of the porous Si is about 100 times that of normal monocrystalline Si. Therefore the porous tentative Si substrate of 200 μm thick was removed in 2 minutes to give a substrate having the monocrystalline Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 44

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a liquid phase growth method to a thickness of 10 μm. The growth conditions were as follows:
Solvent: Sn
Growth temperature: 900° C.
Growth atmosphere: $H_2$
Growth time: 20 min Onto the surface of this epitaxial layer, an optically polished glass substrate having a softening point of about 800° C. was superposed, and the superposed matter was heated in a nitrogen atmosphere at 750° C. for 0.5 hour to bond the tentative substrate and the substrate tightly. Subsequently the porous tentative Si substrate was removed by etching by use of a hydrofluoric nitric acetic acid solution. Thereby the porous tentative Si substrate of 200 μm thick was removed in 2 minutes to give a substrate having the monocrystalline Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2

EXAMPLE 45

A P-type (100) monocrystalline Si plate of 3 inches in diameter and 200 μm in thickness was anodized in a 50 wt % HF solution at a current density of 100 mA/cm². The porous structure formation rate was 8.4 μm/min. The entire of the P-type (100) Si plate of 200 μm thick was made porous in 24 minutes.

On the resulting P-type (100) porous Si plate as a tentative substrate, an Si epitaxial layer was made to grow by a low pressure CVD method to a thickness of 1.0 μm. The deposition conditions were as follows:
Source gas: SiH₄, 800 SCCM
Carrier gas: H₂, 150 l/min
Temperature: 850° C.
Pressure: $1 \times 10^{-2}$ Torr
Growth rate: 3.3 nm/sec Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution. Thereby the porous tentative Si substrate of 200 μm thick was removed in 2 minutes to give a substrate having the monocrystalline Si layer bonded directly thereto.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 2.

In the case where SiH₂Cl₂ was used as the source gas, the temperature of the epitaxial growth of Si was required to be raised by several tens of degrees, but the characteristic enhanced etching properties of the porous tentative substrate were kept.

EXAMPLE 46

On a P-type (100) Si plate of 4 inches in diameter and 300 μm in thickness, an Si epitaxial layer was made to grow to a thickness of 1 μm by a CVD method. The deposition conditions were as follows:
Reactive gas flow rate: SiH₂Cl₂, 1000 SCCM
H₂: 230 l/min
Temperature: 1080° C.
Pressure: 80 Torr
Time: 2 min This P-type (100) Si plate was anodized in a 50 wt % HF solution at a current density of 100 mA/cm². The porous structure formation rate was 8.4 μm/min. The entire of the P-type (100) Si plate of 300 μm thick was made porous in 37 minutes to give a porous tentative Si substrate. In the anodization, the P-type (100) Si plate only was made porous, and the Si epitaxial layer remained intact.

Onto the surface of this epitaxial layer, a fused quartz glass substrate having been optically polished was superposed, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 300 μm thick was removed in 4 minutes to give a substrate having the monocrystalline Si layer bonded directly thereto.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 2.

EXAMPLE 47

On a P-type (100) Si plate of 3 inches in diameter and 200 μm in thickness an Si epitaxial layer was made to grow to a thickness of 0.5 μm by a CVD method. The deposition conditions were as follows:
Reactive gas flow rate: SiH₂Cl₂, 1000 SCCM
H₂: 230 l/min
Temperature: 1080° C.
Pressure: 80 Torr
Time: 1 min This plate was anodized in a 50 wt % HF solution at a current density of 100 mA/cm². The porous structure formation rate was 8.4 μm/min. The entire of the P-type (100) Si plate of 200 μm thick was made porous in 24 minutes to give a porous tentative Si substrate. In the anodization, the P-type (100) Si plate only was made porous, and the Si epitaxial layer remained intact.

Onto the surface of this epitaxial layer, an fused quartz glass having been optically polished was superposed, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution. Thereby the porous tentative Si substrate of 200 μm thick was removed in 2 minutes to give a substrate having the monocrystalline Si layer bonded directly thereto.

The surface of the monocrystalline Si layer on the substrate was oxidized to form an SiO₂ layer of 5000 Å thick. Then one more monocrystalline Si layer was laminated on the SiO₂ layer by use of a tentative substrate having an epitaxially grown monocrystalline Si layer in the same manner as above to obtain a semiconductor wafer as shown in FIG. 2.

EXAMPLE 48

On the surface of a P-type (100) Si plate of 3 inches in diameter and 200 μm in thickness, an N-type Si layer was formed in a thickness of 1 μm by proton ion implantation. The amount of implanted H⁺ was $5 \times 10^{15}$ (ions/cm²).

This plate was anodized in a 50 wt % HF solution at a current density of 100 mA/cm². The porous structure formation rate was 8.4 μm/min. The entire of the 199 μm-thick P-type (100) Si portion of the plate was made porous in 24 minutes to give a tentative substrate. In the anodization, the P-type (100) Si portion only was made porous, and the N-type Si layer remained intact.

Onto the surface of this epitaxial layer, a fused quartz glass Si substrate having been optically polished was superposed, and the superposed matter was heated in a nitrogen atmosphere at 800° C. for 0.5 hour to bond the tentative substrate and the substrate tightly. Subsequently the porous tentative Si substrate was removed by etching by use of a hydrofluoric nitric acetic acid solution (1:3:8). Thereby the porous tentative Si substrate of 200 μm thick was removed in 2 minutes to give a substrate having the monocrystalline Si layer bonded directly thereto.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

EXAMPLE 49

A P-type (100) monocrystalline Si plate of 6 inches in diameter and 600 μm in thickness was anodized in a 50 wt % HF solution at a current density of 10 $mA/cm^2$. A 20-μm thick portion of the surface of the plate was made porous in 10 minutes. On the formed porous layer of the P-type (100) Si plate as the tentative substrate, an Si epitaxial layer was made to grow by low pressure CVD to a thickness of 0.5 μm. The deposition conditions were as follows.

Gas: $SiH_2Cl_2$ (0.6 l/min) $H_2$ (100 l/min)
Temperature: 850° C.
Pressure: 50 Torr
Growth rate: 0.1 μm/min.

Onto the surface of this epitaxial layer, an Si substrate having a 0.8 μm oxide layer was superposed at the oxide side, and was heated in a nitrogen atmosphere at 900° C. for 1.5 hours to bond the tentative substrate and the substrate tightly.

On the opposite side of the substrate, the non-porous 580-μm portion of the tentative substrate was abraded to uncover the porous layer.

The tentative substrate and the substrate bonded together were coated with $Si_3N_4$ in a thickness of 0.1 μm by plasma CVD, and the deposited nitride film on the porous tentative substrate only was removed by reactive ion etching.

Then the bonded porous tentative substrate was etched selectively by hydrofluoric nitric acetic acid solution. In 15 minutes, the porous Si layer was selectively etched and completely removed with the monocrystal Si layer remaining un-etched as an etch-stopping material on the substrate. The etching rate of the non-porous monocrystalline Si in the etching solution was as low as about 40 Å in 15 minutes. Therefore, the selectivity of etching of the porous Si layer was extremely high, and the amount of etching of the non-porous Si layer was practicably negligible. Then by removing the $Si_3N_4$ layer, a substrate was obtained which has monocrystalline Si layer bonded thereto directly.

The surface of the monocrystalline Si layer on the substrate was oxidized to form an $SiO_2$ layer of 5000 Å thick. Then one more monocrystalline Si layer was laminated on the $SiO_2$ layer by use of a tentative substrate having an epitaxially grown monocrystalline Si layer in the same manner as above to obtain a semiconductor wafer as shown in FIG. 2.

In the case where the $Si_3N_4$ layer was replaced by Apiezon Wax coating or Electron Wax coating, the effect was the same, and the porous tentative Si substrate only was removed completely.

EXAMPLE 50

A GaAs type semiconductor layer was laminated in place of the second lamination of monocrystalline Si layer in each of Examples 1 to 49. The lamination of the GaAs type semiconductor was conducted through the steps of growing epitaxially an GaAs semiconductor on a monocrystalline Si layer of the tentative substrate; bonding the GaAs layer to the first lamination layer; and etching off the tentative substrate and a part of the GaAs semiconductor layer. As the results, semiconductor wafers was prepared as shown in FIGS. 1 or 2.

As described above, the present invention provides a semiconductor wafer having monocrystalline semiconductor layers laminated with interposition of an insulating layer, thereby enabling utilization of the monocrystalline semiconductor layers in thickness direction for higher integration of circuits, and provides also a process for producing readily such a laminated semiconductor wafer.

What is claimed is:

1. Process for producing a semiconductor wafer which comprises in order a substrate, a first monocrystalline semiconductor layer, an insulating layer and a second monocrystalline semiconductor layer comprising the steps of:
   (a) bonding a first intermediate laminate formed from (i) a first etch layer of a porous monocrystalline semiconductor and (ii) said first monocrystalline semiconductor layer, onto a surface of said substrate at the first monocrystalline semiconductor layer side;
   (b) removing the first etch layer by etching;
   (c) forming said insulating layer on the etched face of said first monocrystalline semiconductor layer;
   (d) bonding a second intermediate laminate formed from (i) a second etch layer of a porous monocrystalline semiconductor and (ii) a second monocrystalline semiconductor layer, onto said insulating layer at the second monocrystalline semiconductor layer side; and
   (e) removing the second etch layer by etching.

2. The process of claim 1, including the step of providing a second insulating layer between said substrate and said first monocrystalline semiconductor layer.

3. The process of claim 2, wherein said insulating layer is formed from a material selected from the group consisting of $SiO_2$, SiN and $SiO_2$—SiN—$SiO_2$.

4. The process of claim 1, wherein said first and second monocrystalline semiconductor layers are formed from a material selected from the group consisting of monocrystalline silicon and a Group III-V monocrystalline semiconductor.

5. The process of claim 4, wherein said Group III-V monocrystalline semiconductor is a gallium arsenide monocrystalline semiconductor.

6. The process of claim 4, wherein said material is monocrystalline silicon.

7. The process of claim 6, wherein said monocrystalline silicon is formed by molecular beam epitaxy, plasma CVD, bias sputtering, liquid phase growth or low pressure CVD.

8. The process of claim 1, wherein said substrate is selected from the group consisting of silica glass, monocrystalline silicon and borosilicate glass.

9. The process of claim 1, including repeating at least once the steps of forming a second insulating layer on the etched face of said second monocrystalline semiconductor layer; bonding a third intermediate laminate formed from (i) a third etch layer of a porous monocrystalline semiconductor and (ii) a third monocrystalline semiconductor layer, onto said second insulating layer at the third monocrystalline semiconductor layer side, and removing the third etch layer by etching to form a semiconductor wafer having a plurality of monocrystalline semiconductor layers with interposed insulating layers.

10. The process of claim 1, including preparing each said intermediate laminate by anodizing a monocrystalline silicon plate in a hydrofluoric acid solution to form a porous monocrystalline silicon layer and, thereafter, epitaxially growing a monocrystalline semiconductor silicon layer on said porous monocrystalline silicon layer.

11. The process of claim 10 in which the density of the porous monocrystalline silicon layer is controlled from 0.6 to 1.1 g/cm$^3$ by varying the solution concentration of the hydrofluoric acid from 20 to 50% by weight during said anodizing.

12. The process of claim 10, wherein the monocrystalline silicon semiconductor layer is epitaxially grown at low temperatures to prevent rearrangement of pores in said porous monocrystalline silicon.

13. The process of claim 10, wherein said monocrystalline silicon layer is no greater than 50 microns in thickness.

14. The process of claim 1 including employing a monocrystalline silicon substrate having an insulating layer thereon formed by surface oxidizing said substrate to silicon dioxide.

15. The process of claim 1, wherein each said monocrystalline semiconductor layer is a monocrystalline silicon layer and each said insulating layer is formed on the etched face of each said monocrystalline silicon layer by oxidizing the outer surface of said etched face to form a SiO$_2$ insulating layer.

16. The process of claim 1, wherein each said bonding step is conducted at a temperature in the range from 200° to 900° C.

17. The process of claim 1 including the steps of covering said first intermediate laminate and said substrate with an etching protection layer, and, thereafter, removing a portion of said etching protection layer covering the first etch layer, prior to removing the first etch layer by etching.

18. The process of claim 1, wherein each said etch layer is a porous monocrystalline silicon layer, each monocrystalline semiconductor layer is a monocrystalline silicon layer and each said etching is conducted employing an etching solution which etches said porous monocrystalline silicon layer and exhibits minimal etching activity to said monocrystalline silicon layer.

19. The process of claim 18, wherein said etching solution is selected from the group consisting of (i) hydrofluoric acid, (ii) buffered hydrofluoric acid, (iii) hydrofluoric acid admixed with hydrogen peroxide solution, (iv) hydrofluoric acid admixed with an alcohol, (v) buffered hydrofluoric acid admixed with hydrogen peroxide solution, (vi) buffered hydrofluoric acid admixed with an alcohol, (vii) hydrofluoric acid admixed with hydrogen peroxide solution and an alcohol and (viii) buffered by hydrofluoric acid admixed with hydrogen peroxide solution and an alcohol.

20. The process of claim 19, wherein the concentration of hydrofluoric acid in the buffered hydrofluoric acid etching solution is from 1 to 95% by weight of the etching solution.

21. The process of claim 20, wherein the concentration of hydrofluoric acid in the buffered hydrofluoric acid etching solution is 1 to 70% by weight of the etching solution.

22. The process of claim 19, wherein the buffered hydrofluoric acid etching solution contains a mixture of hydrogen fluoride and ammonium fluoride.

23. The process of claim 22, wherein the concentration of ammonium fluoride is from 1 to 95% by weight of the etching solution.

24. The process of claim 23, wherein the concentration of ammonium fluoride is from 5 to 80% by weight of the etching solution.

25. The process of claim 19, wherein the etching solution contains hydrogen peroxide and the concentration of hydrogen peroxide in the etching solution is from 1 to 95% by weight of the etching solution.

26. The process of claim 25, wherein the concentration of hydrogen peroxide is from 10 to 80% by weight of the etching solution.

27. The process of claim 19, wherein the etching solution contains an alcohol and the concentration of said alcohol is no greater than 80% by weight of the etching solution.

28. The process of claim 27, wherein the concentration of said alcohol is no greater than 40% by weight of the etching solution.

29. The process of claim 18, wherein the concentration of hydrofluoric acid in the etching solution is from 1 to 95% by weight of the etching solution.

30. The process of claim 29, wherein the concentration of hydrofluoric acid is from 5 to 80% by weight of the etching solution.

31. The process of claim 1, wherein each said etching is conducted at a temperature from 0 to 100° C.

32. The process of claim 1 including the steps of employing an etch layer which is porous at the surface of one side thereof and said monocrystalline semiconductor layer being formed on said porous side of said etch layer to provide said intermediate laminate and removing said etch layer by polishing off the non-porous portion of the etch layer and thereafter etching the porous portion.

33. The process of claim 1 including the steps of forming at least said first intermediate laminate with a monocrystalline silicon semiconductor layer sandwiched between an etch layer on one side and an epitaxially grown gallium arsenide monocrystalline semiconductor layer on the other side; bonding the gallium arsenide monocrystalline semiconductor layer to the substrate; and, thereafter, removing the etch layer and the monocrystalline silicon semiconductor layer to provide the gallium arsenide monocrystalline semiconductor layer on the substrate as said first monocrystalline semiconductor layer.

34. The process according to claim 1, wherein the bonding in the steps (a) and (d) is carried out with heating.

35. The process of claim 34, wherein the heating is effected under nitrogen atmosphere.

36. A process for producing a semiconductor wafer having a substrate sandwiched by first and second monocrystalline semiconductor layers which comprises:

(a) bonding a first intermediate laminate formed from a first etch layer of a porous monocrystalline semiconductor and a first monocrystalline semiconductor layer onto one side of said substrate at the first monocrystalline semiconductor layer side;

(b) bonding a second intermediate laminate formed from a second etch layer of a porous monocrystalline semiconductor and a second monocrystalline semiconductor layer onto the other side of said substrate at the second monocrystalline semiconductor layer side; and, thereafter, (c) removing the first and second etch layers by etching.

37. The process of claim 36 including the steps of forming an insulation layer on each side of said substrate prior to bonding each said intermediate laminate onto said substrate.

* * * * *